United States Patent
Hsieh

(10) Patent No.: US 7,517,811 B2
(45) Date of Patent: Apr. 14, 2009

(54) METHOD FOR FABRICATING A FLOATING GATE OF FLASH ROM

(75) Inventor: Wen-Kuei Hsieh, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/409,226

(22) Filed: Apr. 8, 2003

(65) Prior Publication Data

US 2004/0092116 A1 May 13, 2004

(30) Foreign Application Priority Data

Nov. 8, 2002 (TW) .............................. 91132982 A

(51) Int. Cl.
*H01L 21/302* (2006.01)
(52) U.S. Cl. .................. 438/756; 438/257; 438/700; 438/754
(58) Field of Classification Search ............. 438/264, 438/296, 294, 424, 592, 593, 745, 753, 257, 438/756
See application file for complete search history.

(56) References Cited

U.S. PATENT DOCUMENTS

| 6,391,722 B1* | 5/2002 | Koh ........................... 438/264 |
| 6,475,894 B1* | 11/2002 | Huang et al. ................ 438/593 |
| 6,541,382 B1* | 4/2003 | Cheng et al. ................ 438/692 |
| 2002/0195646 A1* | 12/2002 | Tseng ........................ 257/315 |

\* cited by examiner

*Primary Examiner*—Lan Vinh
(74) *Attorney, Agent, or Firm*—Muncy, Geissler, Olds & Lowe, PLLC

(57) ABSTRACT

A method for fabricating a floating gate of the flash memories is described. A pad oxide layer and a silicon nitride layer are formed sequentially on a substrate. A plurality of shallow trenches is formed in the substrate and an active area is defined by the shallow trenches. The silicon nitride layer is pulled back by isotropic etching to expose the corner of the trench. A corner-rounding process is performed to round the corner. An STI structure is formed in the shallow trench. Thereafter, the pad oxide layer and the silicon nitride layer are removed. A tunneling oxide layer and a first polysilicon layer are formed sequentially on the active area and the first polysilicon layer is as high as the STI structure. A second polysilicon layer is formed on the first polysilicon layer and the STI structures. A portion of the second polysilicon layer on the STI structure is removed to form the floating gate.

24 Claims, 7 Drawing Sheets

METHOD FOR FABRICATING A FLOATING GATE OF FLASH ROM

BACKGROUND OF THE INVENTION

1. Field of Invention

The present invention relates to a method for fabricating a semiconductor device. More particularly, the present invention relates to a method for fabricating floating gates of flash memories.

2. Description of Related Art

Currently, a flash memory with a high memory cell density has significant applications in various apparatus designs. One main advantage of the flash memory is that each memory cell can be fabricated with greatly reduced dimensions, and fabrication cost is also greatly reduced. In a conventional flash memory, memory cells are isolated by a field oxide (FOX) structure that is formed by local oxidation (LOCOS). The dimensions of the FOX structure can only be reduced within certain limits. As a result, cell density is also limited.

Another typical isolation structure is a shallow trench isolation (STI) structure. Since the STI structure can be formed in a much smaller area than the FOX structure, application of the STI structure in a flash memory can effectively minimize the cell dimension so that the cell density can be ultimately increased. FIGS. 1A-1E are schematic, cross-sectional views of a traditional method for fabricating floating gates of flash memories. Reference is made to FIG. 1A, in which a substrate 100 is provided. A tunneling oxide layer 102, a polysilicon layer 104, a silicon nitride layer 106 and patterned photo-resist layer 108 are sequentially formed on the substrate 100. The patterns of the patterned photo-resist layer 108 are photo-resist opening 110 used to define the position of the shallow trenches on the substrate 100.

Reference is made to FIG. 1B, where the photo-resist layer (not shown) is used as a mask, and the silicon nitride layer 106, the polysilicon layer 104, the tunneling oxide layer 102 and the substrate 100 are etched by an anisotropic etching process to form shallow trenches 112. The photo-resist layer is then removed.

In FIG. 1C, the shallow trenches 112 are filled with silicon oxide and shallow trench isolation (STI) structures 114 are formed. The process for forming the STI structures 114 at least comprises a chemical vapor deposition (CVD) process and a planarization process. The silicon oxide is deposited in the shallow trenches and on the surface of the silicon nitride layer 106. A chemical mechanical polishing process is performed to remove the silicon oxide on the silicon nitride layer 106. The silicon nitride layer 106 is a polishing stop layer.

In FIG. 1D, a portion of the STI structures 114 is removed by an anisotropic selective etching process and STI structures 114a are formed. The height of the STI structures 114a is equal to the height of the polysilicon layer 104.

In FIG. 1E, a polysilicon layer 106 is formed, covering the STI structures 114a and the polysilicon layer 104. A lithographic process and an etching process are then performed to remove a portion of the polysilicon layer 116 on the STI structures 114a and to form a floating gate 118. The floating gate 118 consists the polysilicon layers 104 and 116. The purpose of the polysilicon layer 116 is to increase the overlap between the floating gate and the control gate of the flash memory cell. Consequently, the coupling ratio of the flash memory cell will increase. A higher coupling ratio of the flash memory cell can cause a lower electric voltage needed on the gate when the flash memory cell performs an erasure. Additionally, higher coupling ratio of the flash memory cell can also cause a lower necessary electric field for producing Fowler-Nordheim tunneling and thus increase the speed of the electrons transferring between the floating gate and source/drain becomes faster. The speed of reading/writing processes hence increases.

Although traditional manufacturing methods for flash memory cell can provide higher coupling ratios, several disadvantages affect the electricity of the flash memory cell. A process for filling high aspect ratio trenches is the first disadvantage. The window for semiconductor manufacturing process decreases continually as the demand for higher semiconductor device integration increases. Meanwhile, the opening of a trench becomes smaller. With further reference to figure C, the aspect ration of the trenches 112 increases much more than that of trenches fabricated by conventional processes due to the previously formed additional polysilicon layer 104. Seams are formed easily when the high aspect ratio trenches are filled with silicon oxide by a CVD process. Seams are one of the major reasons for the low yield of the flash memory manufacturing processes.

The second disadvantage is related to the bird's beak. Typically, the trench exposes the tunneling oxide layer 112 on its sidewall. A bird's beak occurs when the tunneling oxide layer undergoes a thermal process with oxygen, such as a silicon oxide CVD deposition process. The tunneling oxide layer near the sidewall of the trench then becomes thicker and the electricity of the memory array is altered and does not follow the original design.

With further reference to FIG. 1B, the substrate 100, the tunneling oxide layer 102 and the polysilicon layer 104 form the sidewalls of the trench 112. Performing a STI corner-rounding process on corner 111 of the substrate 100 is very difficult because the tunneling oxide layer 102 and the polysilicon layer 104 are formed thereon. A liner oxide layer (not shown) has to be deposited on the sidewall and bottom of the trench prior to forming the STI structures 114 by a CVD trench filling process. If the corner 111 is not rounded by the STI corner-rounding process, the portion of the liner oxide layer covering this position is thinner. The electricity of the thinner liner oxide layer is reduced and the reliability of the liner oxide layer decreases. The lower reliability of the liner oxide layer is the third disadvantage of the traditional manufacture method for flash memory.

Yet another disadvantage related to the manufacturing process is described with reference to FIG. 1D. Portion of the STI structures are removed by an anisotropic selective etching process and STI structures 114a are formed. The height of the STI structures 114a is equal to the height of the polysilicon layer 104. In practice, it is difficult to form the STI structures 114a to that they are equal to the height of the polysilicon layer 104 in an anisotropic selective etching process. If the height difference between the STI structures 114a and the polysilicon layer 104 exceeds tolerance, the size of the floating gate shown in FIG. 1E will be different; therefore, the electricity of the flash memory cells will different.

SUMMARY OF THE INVENTION

It is therefore a first objective of the present invention to provide a manufacturing method for floating gates of flash memory cells, in which the floating gates can be formed on the STI structures by a self-aligned process.

It is a second objective of the present invention to provide a manufacturing method for floating gates of flash memory cells, in which the aspect ratio for the trench filling process is lowered.

It is a third objective of the present invention to provide a manufacturing method for floating gates of flash memory cells, in which the bird's beak of the tunneling oxide layer can be avoided.

It is a fourth objective of the present invention to provide a manufacturing method for floating gates of flash memory cells, in which the corner of the substrate is rounded easily by the STI corner-rounding process. A uniform liner oxide layer is formed in the subsequent processes.

It is a fifth objective of the present invention to provide a manufacturing method for floating gates of flash memory cells, in which removing the STI structures is not necessary, therefore, the size of the floating gates is uniform.

It is a sixth objective of the present invention to provide a manufacturing method for floating gates of flash memory cells, in which the polysilicon spacer process is used to decrease one mask process and lowers the manufacturing cost.

In accordance with the foregoing and other objectives of the present invention, a manufacturing method is disclosed in the first embodiment for floating gates of flash memory cells. A first silicon oxide layer and a dielectric layer are formed sequentially on a substrate. The material for forming the dielectric layer is silicon nitride. The dielectric layer is patterned and used as a mask. The silicon oxide layer and the substrate are etched by an anisotropic etching process to form a plurality of trenches in the substrate so that an active area, defined by every two trenches, is simultaneously formed. A portion of the patterned dielectric layer is removed by an isotropic etching process and exposes corners of the trenches. A thermal process is performed to round the corners; element isolation structures are hence formed in the trenches, in which the element isolation structures are STI structures. The process for forming the STI structures further comprises a liner oxide layer formed on the sidewall and bottom of the trench prior to forming the STI structure.

Next, the patterned dielectric layer and the first oxide layer are removed, and a second silicon oxide layer is then formed on the active area, in which the second silicon oxide layer is a tunneling oxide layer. A first conductive layer is formed on the second silicon oxide layer and covers the STI structures. Portion of the first conductive layer higher than the STI structure is removed by a CMP process. A second conductive layer is then formed covering the first conductive layer and the STI structures. Finally, lithographic and etching processes are performed to remove a portion of the second conductive layer on the STI structures and expose the surface of the STI structures.

In the manufacturing method of the floating gate of the flash memory cell disclosed in the first embodiment of the present invention, in which the aspect ratio for the trench filling process is lowered and the tunneling oxide needs not undergo a thermal oxide process, the bird's beak of the tunneling oxide layer can be avoided. The corners of the substrate can be rounded by the STI corner-rounding process, and a uniform liner oxide layer is formed in the subsequent processes. Additionally, removing the STI structures is not necessary; therefore, the size of the floating gates is uniform.

In accordance with the foregoing and other objectives of the present invention, another manufacturing method for floating gates of flash memory cells is further provided in the second embodiment of the present invention. A first silicon oxide layer and a dielectric layer are formed sequentially on a substrate. The material for forming the dielectric layer is silicon nitride. The dielectric layer is patterned and used as a mask, the silicon oxide layer and the substrate are etched by an anisotropic etching process to form a plurality of trenches in the substrate so that an active area, defined by every two trenches, is simultaneously formed. A portion of the patterned dielectric layer is removed by an isotropic etching process and exposes corners of the trenches. A thermal process is performed to round the corners; element isolation structures are hence formed in the trenches, in which the element isolation structures are STI structures. The process for forming the STI structures further comprises a liner oxide layer formed on the sidewall and bottom of the trench prior to forming the STI structure.

Next, the patterned dielectric layer and the first oxide layer are removed, and a second silicon oxide layer is then formed on the active area, in which the second silicon oxide layer is a tunneling oxide layer. A first conductive layer is formed on the second silicon oxide layer and covers the STI structures. Portion of the first conductive layer higher than the STI structures is removed by a CMP process. Portion of the STI structures are removed by an anisotropic selective etching process and the STI structures are higher than the second silicon oxide layer. A second conductive layer is then formed, covering the first conductive layer and the STI structures. Finally, a self-aligned etching process is performed to remove a portion of the second conductive layer on the STI structures and expose the surface of the STI structures.

In the manufacturing method of the floating gate of the flash memory cell disclosed in the second embodiment of the present invention, in which the aspect ratio for the trench filling process is lowered and the tunneling oxide needs not undergo a thermal oxide process, a bird's beak of the tunneling oxide layer can be avoided. The corners of the substrate can be rounded by the STI corner-rounding process, and a uniform liner oxide layer is formed in the subsequent processes. Additionally, the floating gates can be formed on the STI structures by a self-aligned process and one mask process is saved, thus lowering the manufacturing cost.

It is to be understood that both the foregoing general description and the following detailed description are examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A to 2D and 2F to 2H are schematic, cross-sectional views of the method for fabricating floating gates of flash memories according to the second preferred embodiment of this invention.

DESCRIPTION OF THE PREFERRED EMBODIMENTS

Figure 1A:
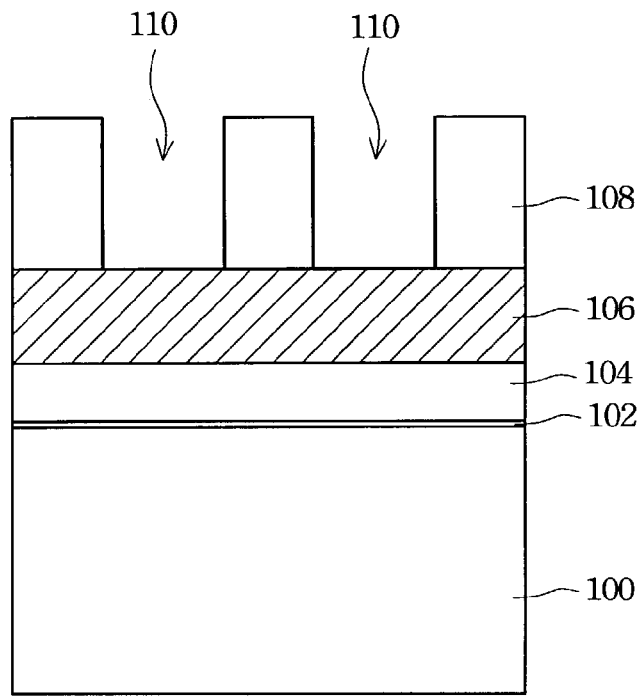
FIGS. 1A to 1E are schematic, cross-sectional views of a traditional method for fabricating floating gates of flash memories.
Figure 1B:
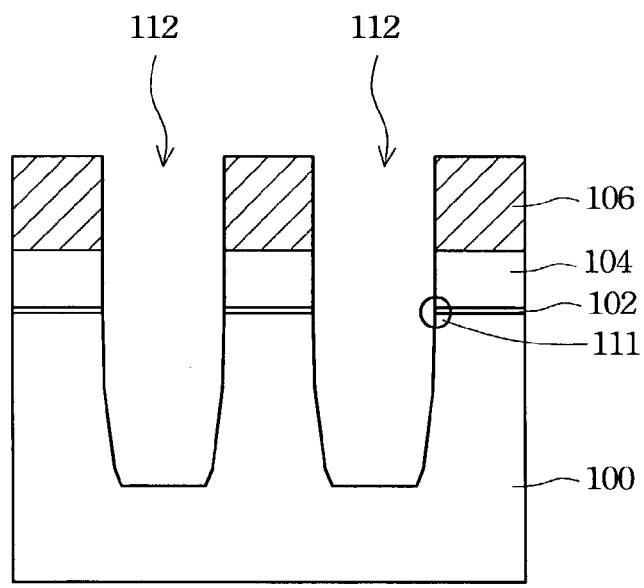
Figure 1C:
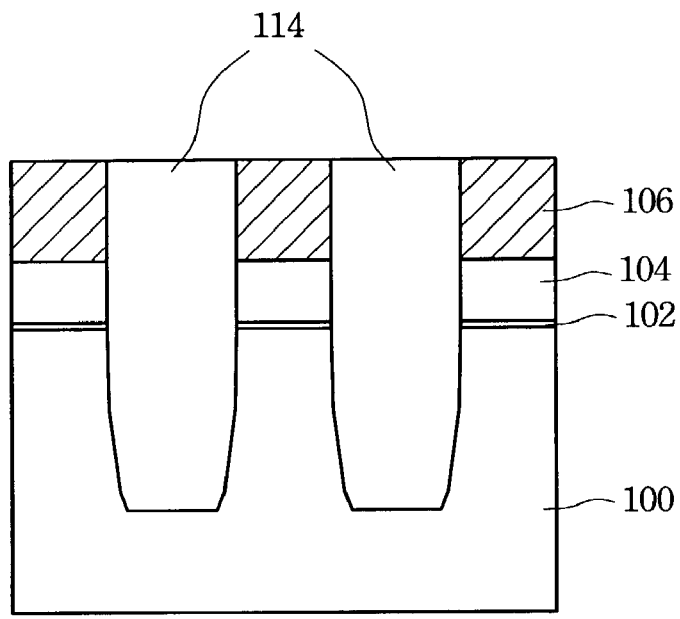
Figure 1D:
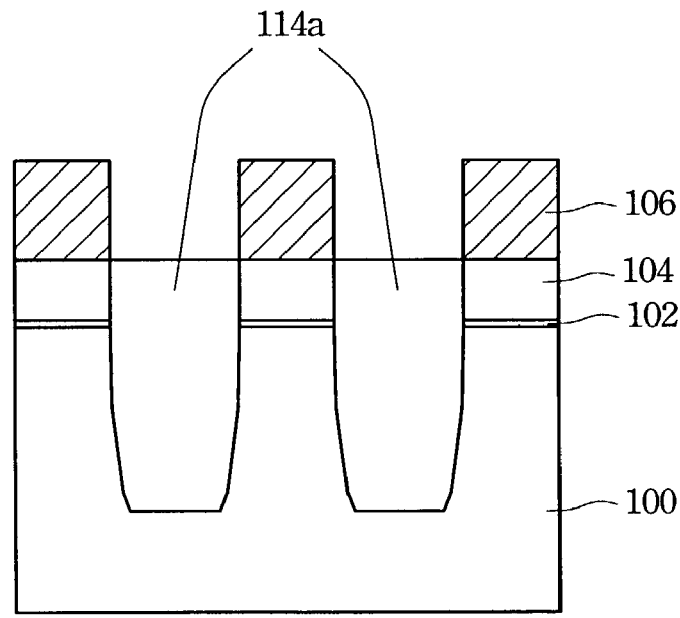
Figure 1E:
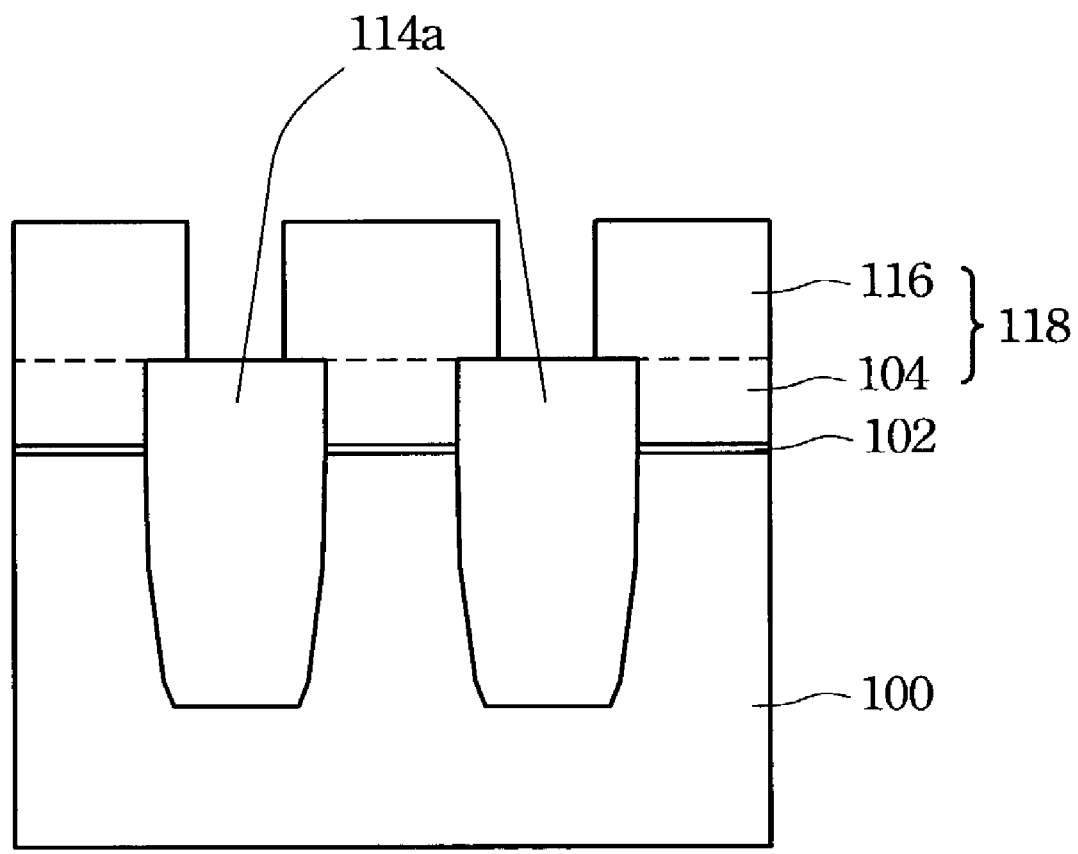

Reference will now be made in detail to the present preferred embodiments of the invention, examples of which are illustrated in the accompanying drawings. Wherever possible, the same reference numbers are used in the drawings and the description to refer to the same or like parts.

Embodiment 1

FIGS. 2A to 2E are schematic, cross-sectional views of the method for fabricating floating gates of flash memories according to the first preferred embodiment of present invention.

Figure 2A:
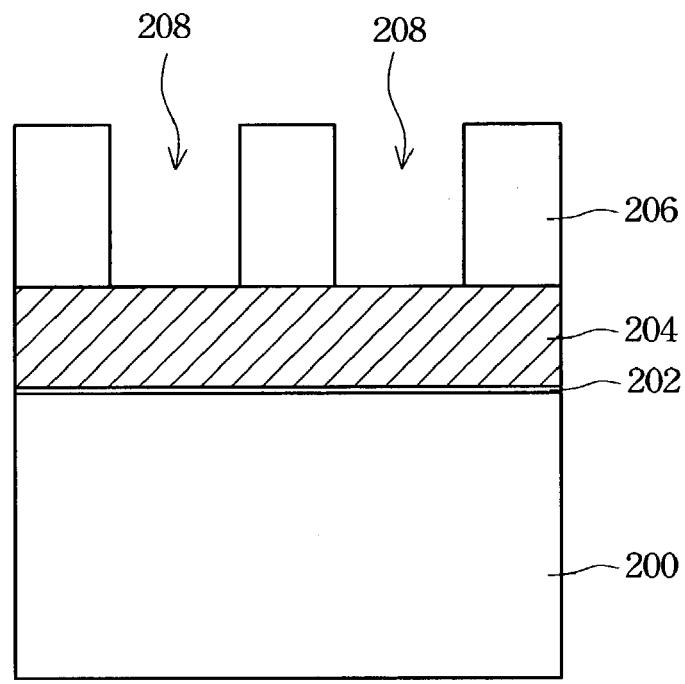
FIGS. 2A to 2E are schematic, cross-sectional views of the method for fabricating floating gates of flash memories according to the first preferred embodiment of this invention.

In FIG. 2A, a first silicon oxide layer 202, a silicon nitride layer 204 and a patterned photo-resist later 206 are formed sequentially on a substrate 200. The patterns of the patterned photo-resist layer 206 are photo-resist opening 208 used to define the position of the shallow trenches on the substrate 200. The method for forming the first silicon oxide layer 202 comprises a thermal oxide process or a chemical vapor deposition process. The method for forming the silicon nitride layer 204 comprises a chemical vapor deposition process. The thickness of the silicon nitride layer 204 is between about 700 and 2000 angstroms. The first silicon oxide layer 202 is a pad oxide and the silicon nitride layer 204 is used as a mask for forming STI structure.

Figure 2B:
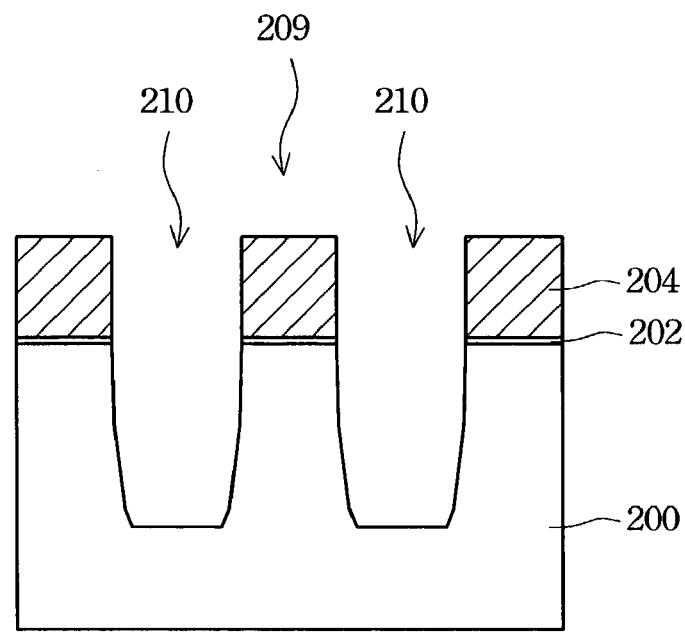

In FIG. 2B, the silicon nitride layer 204 is patterned and the photo-resist layer 208 is removed. While using the patterned silicon nitride layer 204 as a mask, the silicon oxide layer 202 and the substrate 200 are etched by an anisotropic etching process to form a plurality of trenches 210 in the substrate 200 so that an active area 209, defined by every two trenches 210, is simultaneously formed.

Figure 2C:
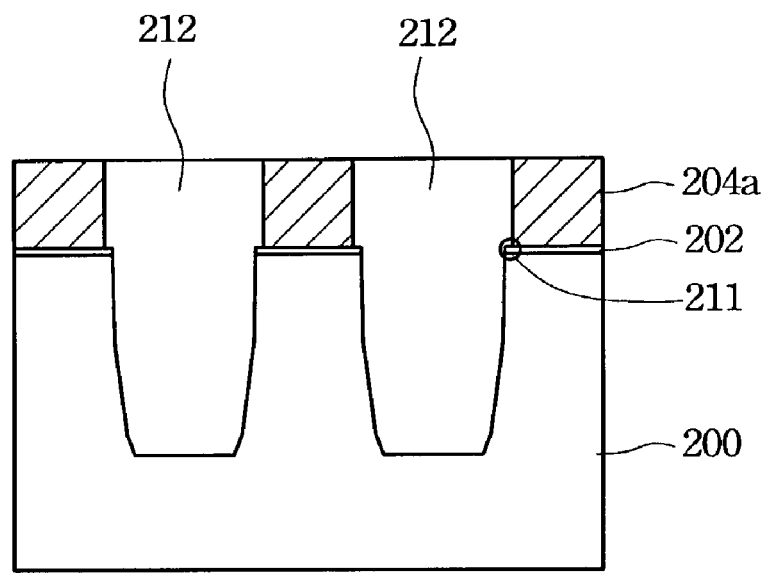

In FIG. 2C, a portion of the patterned silicon nitride layer 204 is removed by isotropic etching process to form a silicon nitride layer 204a and exposes corners 211 of the trenches 210. The isotropic etching process comprises a wet etching. The thickness of the removed silicon nitride layer 204 is between about 50 and 300 angstroms. A thermal process is performed to round the corners 211; STI structures 212 are hence formed in the trenches 210. The method for forming the STI structures 212 comprises a liner oxide layer (not shown in the scheme) formed on the sidewall and bottom of the trench prior to forming the STI structures 212. A material such as silicon oxide is deposited by chemical vapor deposition to fill the trenches 210 and cover the silicon nitride layer 204a. A planarization process is performed and the silicon nitride layer 204a is used as a polishing stop layer; a portion of the silicon oxide higher the silicon nitride layer 204a is removed by CMP to make the STI structures and the silicon nitride layer 204a equal in height.

Figure 2D:
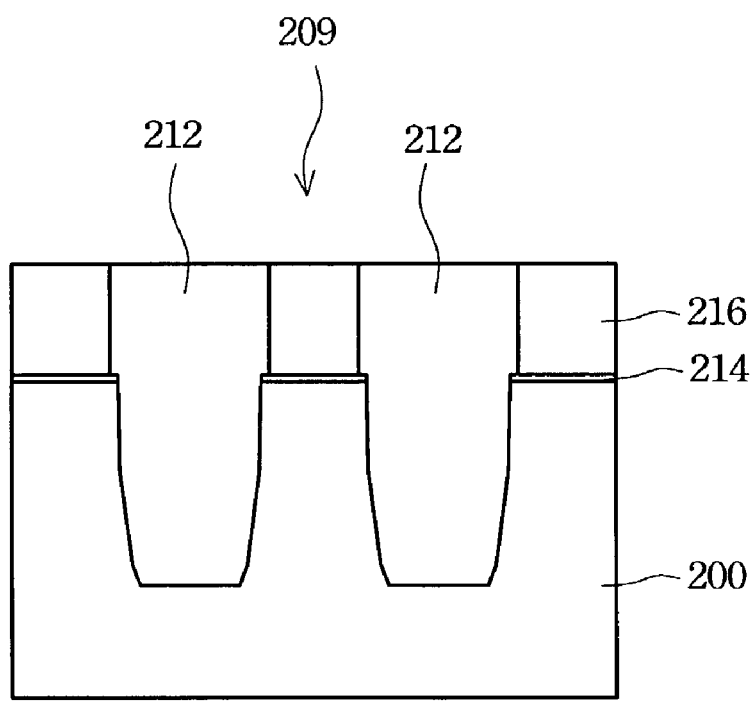

In FIG. 2D, the silicon nitride layer 204a and the first oxide layer 202 are removed to expose the surface of the active area 209. The method for removing the silicon nitride layer 204a comprises a wet etching using hot phosphoric acid or an anisotropic plasma etching. The method for removing the first silicon oxide layer 202 comprises a wet etching using a solution containing fluoride. A second silicon oxide layer 214 is then formed on the active area 209, in which the second silicon oxide layer 214 is a tunneling oxide layer. The method for forming the second silicon oxide layer 214 comprises a thermal process. The thickness of the second silicon oxide layer 214 is between about 20 and 150 angstroms. A first polysilicon layer is formed on the second silicon oxide layer 214 and covers the STI structures 212. The method for forming the first polysilicon layer comprises a chemical vapor deposition process. Portion of the first polysilicon layer higher than the STI structures is removed by a CMP process to form a first floating gate 216. The thickness of the first floating gate 216 is between about 400 and 1500 angstroms.

Figure 2E:
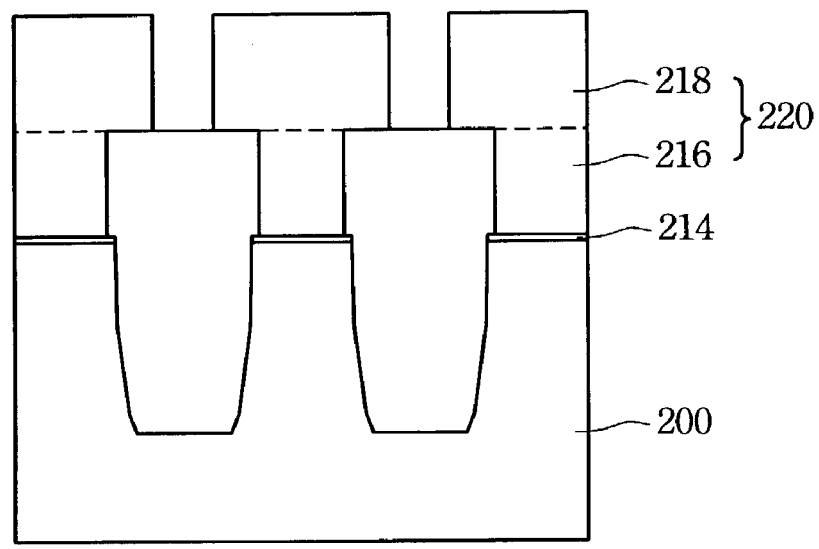

In FIG. 2E, a second polysilicon layer is then formed covering the first floating gate 216 and the STI structures 212. The method for forming the second polysilicon layer comprises a chemical vapor deposition process and the thickness of the second polysilicon layer is between about 500 and 2000 angstroms. Finally, lithographic and etching processes are performed to remove a portion of the second conductive layer on the STI structures 212 to expose the surface of the STI structures 212 and to form a second floating gate 216. The combination of the first floating gate 216 and the second floating gate 218A forms a floating gate 220.

Embodiment 2

FIGS. 2A to 2D and 2F to 2H are schematic, cross-sectional views of the method for fabricating floating gates of flash memories according to the second preferred embodiment of this invention.

Figure 2F:
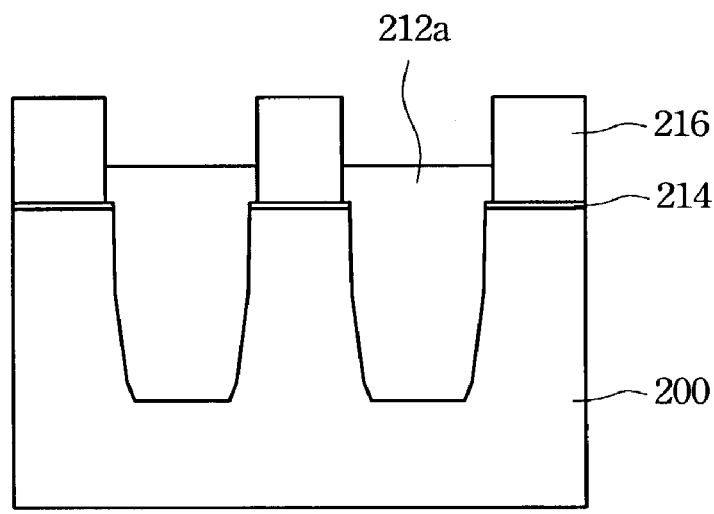

The manufacturing processes of all structures disclosed in the FIGS. 2A to 2D are shown in the first embodiment. In FIG. 2F, a portion of the STI structures 212 are removed by an anisotropic selective etching process to form STI structures 212a, which are higher than the second silicon oxide layer 214. The method for removing portion of the STI structures comprises an anisotropic etching process.

Figure 2G:
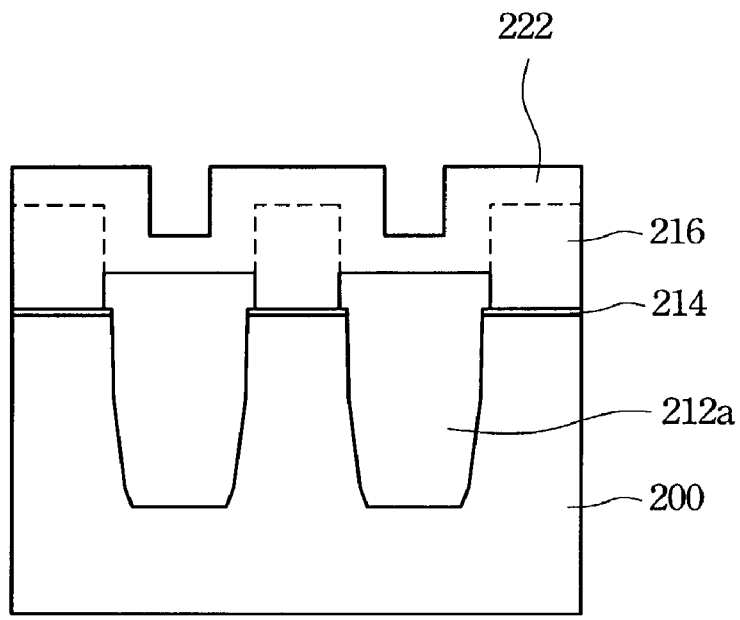

In FIG. 2G, a conformal second polysilicon layer 222 is then formed covering the first polysilicon layer 216 and the STI structures 212a. The method for forming the second polysilicon layer comprises a chemical vapor deposition process and the thickness of the second polysilicon layer is between about 500 and 2000 angstroms.

Figure 2H:
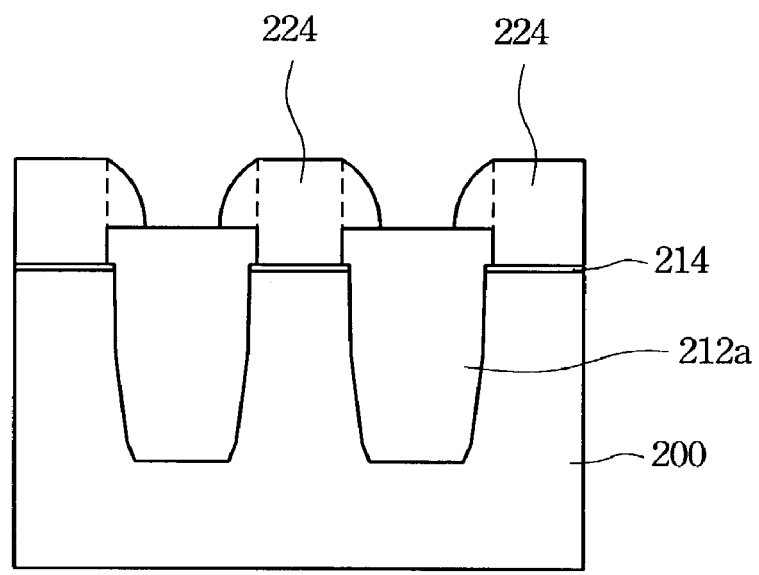

In FIG. 2H, a self-aligned etching process is performed to remove a portion of the second polysilicon layer 222 on the STI structures 212a to expose the surface of the STI structures 212a and to form a floating gate 224. The method for removing portion of the second polysilicon layer 222 comprises a reactive ionic etching process.

In the manufacturing method of the floating gate of the flash memory cell disclosed in the first embodiment of the present invention, in which the aspect ratio for the trench filling process is lowered, the tunneling oxide does not undergo a thermal oxide process and the bird's beak of the tunneling oxide layer can be avoided. The corners of the substrate can be rounded by the STI corner-rounding process and a uniform liner oxide layer is formed in the subsequent processes and removing the STI structures is not necessary. As a result, the size of the floating gates is uniform.

Similarly, in the manufacturing method of the floating gate of the flash memory cell disclosed in the second embodiment of the present invention, the aspect ratio for the trench filling process is lowered, the tunneling oxide does not undergo a thermal oxide process, the bird's beak of the tunneling oxide layer can be avoided, the corners of the substrate can be rounded by the STI corner-rounding process and a uniform liner oxide layer is formed in the subsequent processes. Furthermore, the floating gates can be formed on the STI structures by a self-aligned process and one mask process is saved. Consequently, the manufacturing cost is lower.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a floating gate of a flash memory formed on a substrate, the method comprising:
   sequentially forming a oxide layer and a dielectric layer on the substrate;
   patterning the dielectric layer;
   etching the oxide layer and the substrate while using the patterned dielectric layer as a mask to form shallow trenches;
   removing a portion of the dielectric layer by isotropic etching to expose corners of the shallow trenches;
   rounding the corners by a thermal process;
   forming isolation structures in the substrate, the oxide layer and the dielectric layer to define at least one active region;
   removing the dielectric layer and the oxide layer;
   forming a tunneling oxide layer on the active region after forming the isolation structures;
   forming a first conductive layer on the tunneling oxide layer, wherein all top surfaces of the conductive layer and the isolation structures are coplanar;
   forming a second conductive layer covering the first conductive layer and the isolation structures; and
   removing a portion of the second conductive layer on the isolation structures to expose the top surfaces of the isolation structures to form the floating gate.

2. The method of claim 1, wherein a material for forming the first conductive layer and the second conductive layer is polysilicon.

3. The method of claim 1, wherein a thickness of the first conductive layer is between about 400 angstroms and 1500 angstroms.

4. The method of claim 1, wherein a material for forming the dielectric layer is silicon nitride.

5. The method of claim 1, wherein a thickness of the dielectric layer is between about 700 angstroms and 2000 angstroms.

6. The method of claim 1, wherein a thickness of the tunneling oxide layer is between about 20 angstroms and 150 angstroms.

7. The method of claim 1, wherein the isolation structures are shallow trench isolation structures.

8. The method of claim 1, wherein a thickness of the dielectric layer removed is between about 50 angstroms and 300 angstroms.

9. The method of claim 1, wherein the isotropic etching is a wet etching.

10. The method of claim 1, wherein a thickness of the second conductive layer is between about 500 angstroms and 2000 angstroms.

11. A method for forming a floating gate of a flash memory formed on a substrate, the method comprising:
   sequentially forming a oxide layer and a silicon nitride layer on the substrate;
   patterning the silicon nitride layer;
   etching the oxide layer and the substrate while using the patterned silicon nitride layer as a mask to form shallow trenches to define at least one active region;
   removing portion of the silicon nitride layer by isotropic etching to expose corners of the shallow trenches;
   rounding the corners by a thermal process;
   forming isolation structures in the shallow trenches;
   removing the silicon nitride layer and the oxide layer;
   forming a tunneling oxide layer on the active region after forming the isolation structures;
   forming a first polysilicon layer on the tunneling oxide layer, wherein all top surfaces of the first polysilicon and the isolation structures are coplanar;
   forming a second polysilicon layer covering the first polysilicon layer and the isolation structures; and
   removing a portion of the second polysilicon layer on the isolation structures to expose the top surface of the isolation structures to form the floating gate.

12. The method of claim 11, wherein a thickness of the first polysilicon layer is between about 400 angstroms and 1500 angstroms.

13. The method of claim 11, wherein a thickness of the silicon nitride layer is between about 700 angstroms and 2000 angstroms.

14. The method of claim 11, wherein a thickness of the tunneling oxide layer is between about 20 angstroms and 150 angstroms.

15. The method of claim 11, wherein a thickness of the silicon nitride layer removed is between about 50 angstroms and 300 angstroms.

16. The method of claim 11, wherein the isotropic etching is a wet etching.

17. A method for forming a floating gate of a flash memory formed on a substrate, the method comprising:
   sequentially forming a first oxide layer and a dielectric layer on the substrate;
   patterning the dielectric layer;
   etching the first oxide layer and the substrate while using the patterned dielectric layer as a mask to form shallow trenches to define at least one active region;
   removing portion of the dielectric layer by isotropic etching to expose corners of the shallow trenches, rounding the corners by a thermal process;
   forming isolation structures in the shallow trenches;
   removing the dielectric layer and the first oxide layer;
   forming a second oxide layer on the active region;
   forming a first conductive layer on the second oxide layer, wherein top surfaces of the first conductive layer and the isolation structures are coplanar;
   removing portions of the isolation structures, wherein remaining isolation structures are higher than the second oxide layer;
   forming a second conductive layer covering the first conductive layer and the isolation structures; and
   removing a portion of the second conductive layer by anisotropic etching to expose the top surfaces of the isolation structures.

18. The method of claim 17, wherein a material for forming the first conductive layer and the second conductive layer is polysilicon.

19. The method of claim 17, wherein a thickness of the first conductive layer is between about 400 angstroms and 1500 angstroms.

20. The method of claim 17, wherein a material for forming the dielectric layer is silicon nitride.

21. The method of claim 17, wherein a thickness of the dielectric layer is between about 700 angstroms and 2000 angstroms.

22. The method of claim 17, wherein a thickness of the second oxide layer is between about 20 angstroms and 150 angstroms.

23. The method of claim 17, wherein a thickness of dielectric layer removed is between about 50 angstroms and 300 angstroms.

24. The method of claim 17, wherein the isotropic etching is a wet etching.

* * * * *